US011139306B2

(12) United States Patent
Ikeda

(10) Patent No.: US 11,139,306 B2
(45) Date of Patent: Oct. 5, 2021

(54) MEMORY DEVICE AND METHOD FOR FABRICATING THE SAME

(71) Applicant: WINBOND ELECTRONICS CORP., Taichung (TW)

(72) Inventor: Noriaki Ikeda, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/424,143

(22) Filed: May 28, 2019

(65) Prior Publication Data

US 2020/0381439 A1 Dec. 3, 2020

(51) Int. Cl.
*H01L 27/108* (2006.01)

(52) U.S. Cl.
CPC .. *H01L 27/10888* (2013.01); *H01L 27/10823* (2013.01); *H01L 27/10885* (2013.01); *H01L 27/10897* (2013.01)

(58) Field of Classification Search
CPC ......... H01L 27/10888; H01L 27/10823; H01L 27/10897; H01L 27/10885
See application file for complete search history.

(56) References Cited

U.S. PATENT DOCUMENTS

| | | | | |
|---|---|---|---|---|
| 6,009,023 A | * | 12/1999 | Lu | H01L 27/105 257/E21.645 |
| 2002/0064898 A1 | * | 5/2002 | Adachi | G11C 16/10 438/41 |
| 2011/0156107 A1 | * | 6/2011 | Bohr | H01L 21/76849 257/288 |
| 2011/0297912 A1 | | 12/2011 | Samachisa et al. | |
| 2013/0264655 A1 | * | 10/2013 | Kishida | H01L 21/823871 257/392 |
| 2015/0333013 A1 | * | 11/2015 | Kim | H01L 29/66666 257/368 |
| 2019/0386010 A1 | * | 12/2019 | Tomoyama | H01L 27/10888 |

* cited by examiner

*Primary Examiner* — Marcos D. Pizarro
*Assistant Examiner* — Sue Tang
(74) *Attorney, Agent, or Firm* — Muncy, Geissler, Olds & Lowe, P.C.

(57) ABSTRACT

A memory device including a substrate, a non-doped semiconductor layer, a plurality of contact portions and a metal-stacking layer is provided. The substrate includes a plurality of word lines and a plurality of isolation structures. The non-doped semiconductor layer is disposed on the substrate. The contact portions are adjacent to the non-doped semiconductor layer and in direct contact with the substrate. The metal-stacking layer is disposed on the substrate. A portion of the metal-stacking layer is disposed on the non-doped semiconductor layer and in direct contact with the contact portions.

20 Claims, 17 Drawing Sheets

MEMORY DEVICE AND METHOD FOR FABRICATING THE SAME

BACKGROUND

Technical Field

Embodiments of the present disclosure relate to a memory device and a method for fabricating the same, and in particular they relate to a memory device with a non-doped semiconductor layer and a method for fabricating the same.

Description of the Related Art

Dynamic Random Access Memory (DRAM) devices are widely used in consumer electronic products, such as personal computers, smartphones and tablet computers. Generally, the steps for fabricating a DRAM device may include forming metal oxide semiconductor (MOS) transistors and contacts on a substrate, and subsequently forming capacitors on the contacts. The capacitors may be electrically connected to the substrate and the MOS transistors through the contacts.

In most DRAM devices, a doped polysilicon/metal stack may be used as a bit line structure. However, such a structure may cause high parasitic capacitance due to the high height of the bit line structure.

In some examples, the doped polysilicon/metal stack bit line structure may be replaced by a metal bit line structure to reduce the high parasitic capacitance. However, such a structure may increase the gap between the cell region and the peripheral region of the DRAM device. It therefore increases the difficulty of the fabricating processes.

SUMMARY

In accordance with some embodiments of the present disclosure, a method for fabricating a memory device is provided. The method includes: providing a substrate, wherein the substrate comprises a plurality of word lines and a plurality of isolation structures; forming a semiconductor layer on the substrate; patterning the semiconductor layer and the substrate to form a plurality of trenches, wherein the trenches expose portions of the substrate; forming a doped-material layer on the semiconductor layer and filling the trenches; removing a portion of the doped-material layer to form a plurality of contact portions, such that the top surface of each of the contact portions is aligned, with or lower than, the top surface of the semiconductor layer; and forming a metal-stacking layer on the semiconductor layer, wherein the metal-stacking layer is in direct contact with the contact portions.

In accordance with some embodiments of the present disclosure, a memory device including a substrate, a non-doped semiconductor layer, a plurality of contact portions and a metal-stacking layer is provided. The substrate includes a plurality of word lines and a plurality of isolation structures. The non-doped semiconductor layer is disposed on the substrate. The contact portions are adjacent to the non-doped semiconductor layer and in direct contact with the substrate. The metal-stacking layer is disposed on the substrate. A portion of the metal-stacking layer is disposed on the non-doped semiconductor layer and in direct contact with the contact portions.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
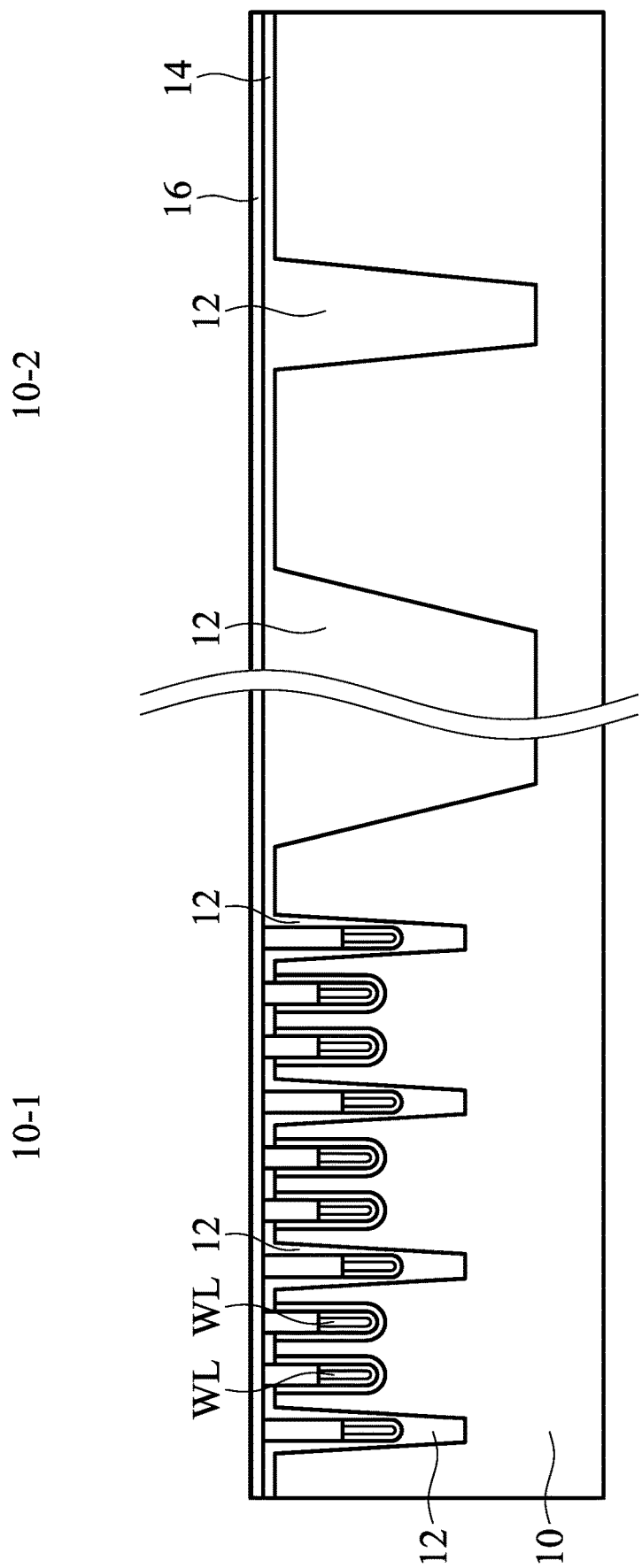
FIGS. 1-15 illustrate cross-sectional views at various stages of forming a memory device in accordance with an embodiment of the present disclosure.

First, as shown in FIG. 1, a substrate 10 is provided. In some embodiments, the material of the substrate 10 may be, but is not limited to, an elemental semiconductor substrate (which may include silicon, germanium), a compound semiconductor substrate (which may include tantalum carbide, gallium arsenide, indium arsenide or indium phosphide), an alloy semiconductor substrate (which may include silicon germanium, silicon germanium carbide, gallium arsenic phosphide or gallium indium phosphide), a semiconductor-on-insulator (SOI) substrate, and so on.

In this embodiment, the substrate 10 may include a plurality of word lines WL and a plurality of isolation structures 12. The word lines WL and the isolation structures 12 may be buried in the substrate 10, but the present disclosure is not limited thereto. For example, a pair of neighbor word lines WL may be disposed between two isolation structures 12 as shown in FIG. 1.

In some embodiments, the isolation structure 12 may be a shallow trench isolation, STI), and the material of the isolation structure 12 may include an insulating material, such as silicon oxide, silicon nitride, silicon oxynitride, or the like, but the present disclosure is not limited thereto. The isolation structures 12 may be formed by an etching process and a deposition process.

In some embodiments, the material of the word line WL may include a conductive material, such as amorphous silicon, polysilicon, metal, metal nitride, conductive metal oxide, or the like, but the present disclosure is not limited thereto. The word lines WL may be formed by an etching process and a deposition process.

In some embodiments, a silicon oxide layer 14 and a silicon nitride layer 16 may be sequentially formed on the substrate 10 as shown in FIG. 1. Here, the silicon oxide layer 14 and the silicon nitride layer 16 may be formed by a deposition process.

Figure 2:
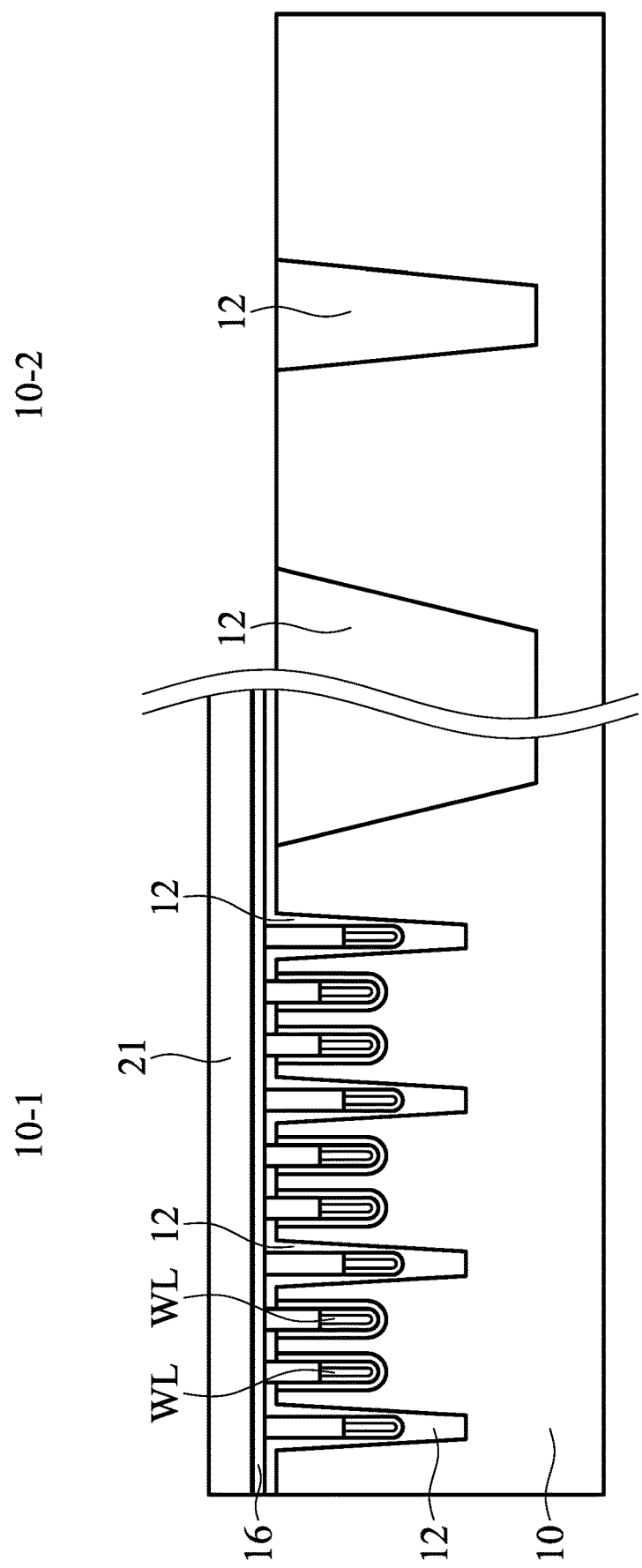

In this embodiment, the substrate 10 may be divided into a cell region 10-1 and a peripheral region 10-2. As shown in FIG. 2, a photoresist layer 21 may be formed on the substrate 10 (silicon nitride layer 16) in the cell region 10-1, and the silicon oxide layer 14 and the silicon nitride layer 16 may be removed in the peripheral region 10-2. For example, the silicon oxide layer 14 and the silicon nitride layer 16 may be removed in the peripheral region 10-2 by a patterning process. In some embodiments, the patterning process may include, but is not limited to, a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Figure 3:
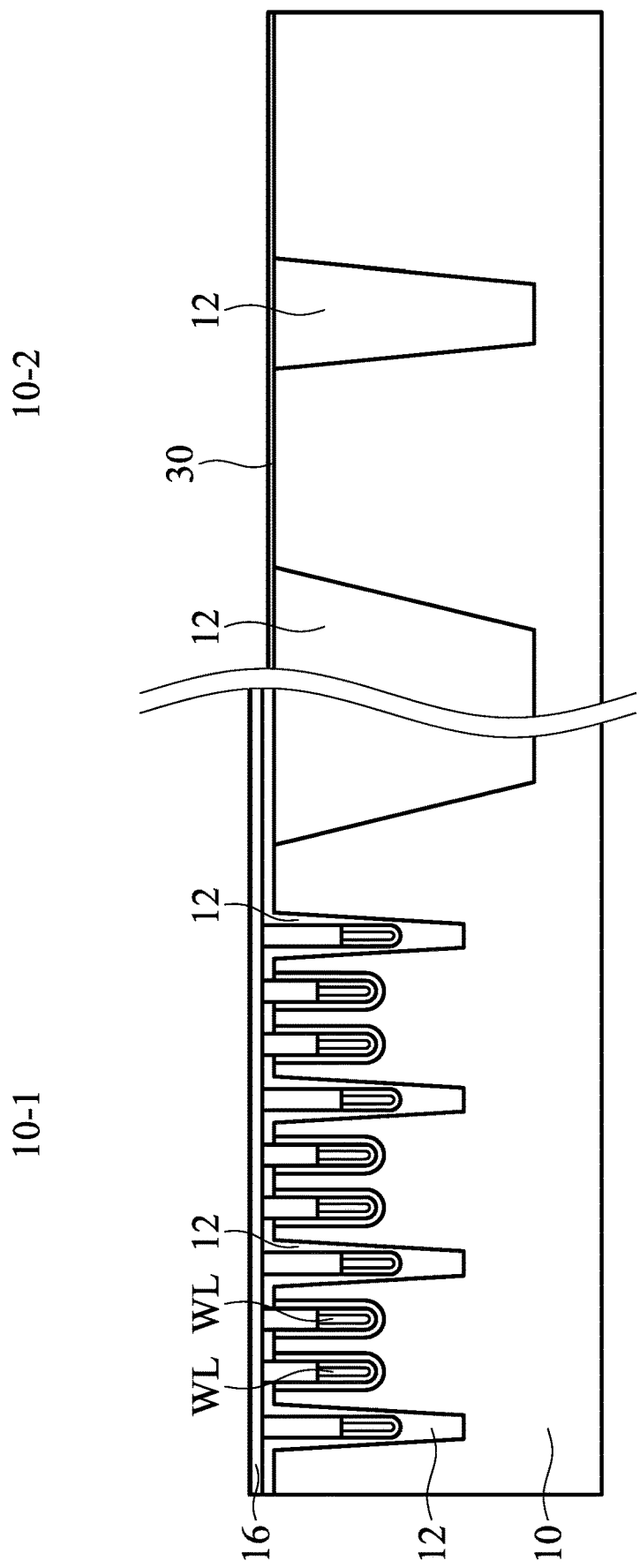

As shown in FIG. 3, a dielectric layer 30 may be formed on the substrate 10 in the peripheral region 10-2. In some embodiments, the material of the dielectric layer 30 may include, but is not limited to, silicon oxide (SiO), silicon nitride (SiN), silicon oxynitride (SiON), hafnium silicon oxynitride (HfSiON), other applicable dielectric materials, or a combination thereof. In some embodiments, the dielectric layer 30 may be formed on the substrate 10 in the peripheral region 10-2 by oxidation, chemical vapor deposition (CVD), plasma-enhanced chemical vapor deposition (PECVD), other applicable processes, or a combination thereof, but the present disclosure is not limited thereto.

Figure 4:
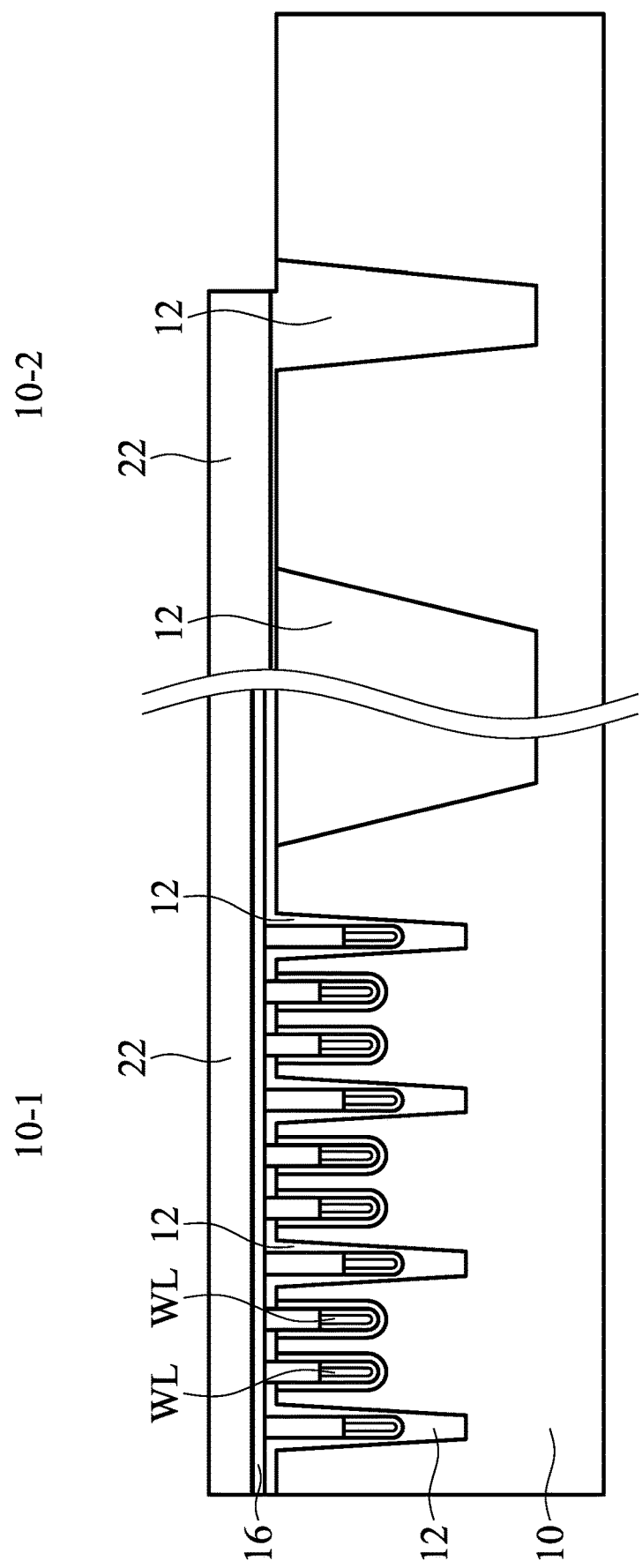

As shown in FIG. 4, in some embodiments, a portion of the dielectric layer 30 may be removed. For example, a photoresist layer 22 may be formed on the substrate 10 (silicon nitride layer 16) and the portion of the dielectric layer 30 (in the peripheral region 10-2) may be removed. Similarly, the portion of the dielectric layer 30 may be removed by a patterning process. In some embodiments, the patterning process may include, but is not limited to, a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Figure 5:
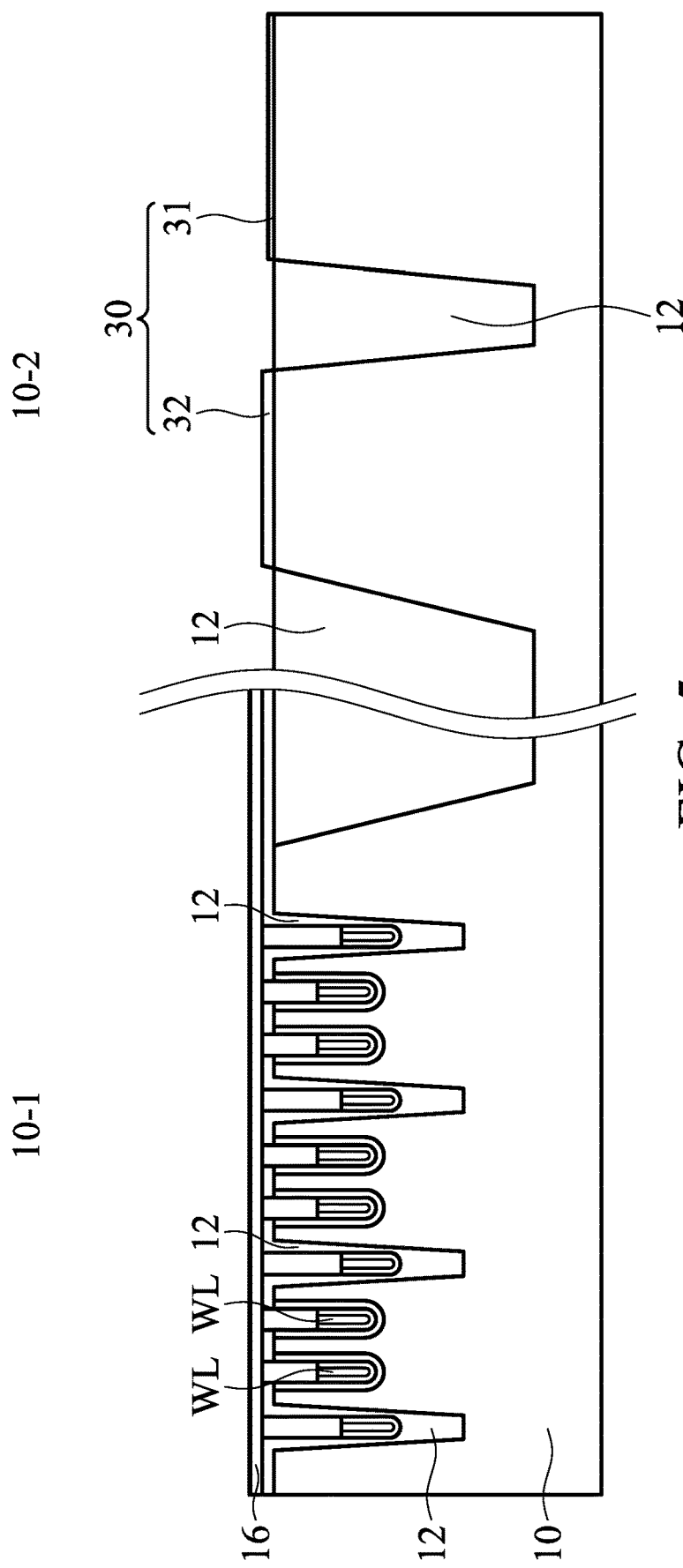

As shown in FIG. 5, in some embodiments, the dielectric layer 30 may be formed again on the substrate 10 in the peripheral region 10-2 to form a first dielectric layer 31 and a second dielectric layer 32. Here, the second dielectric layer 32 is thicker than the first dielectric layer 31. For example, the thickness of the first dielectric layer 31 may be about 2 nm to 3 nm, while the thickness of the second dielectric layer 32 may be about 5 nm to 6 nm, but the present disclosure is not limited thereto. In other embodiments, the steps as shown in FIG. 4 and FIG. 5 may be omitted, such that the first dielectric layer 31 and the second dielectric layer 32 may have the same thickness.

Figure 6:
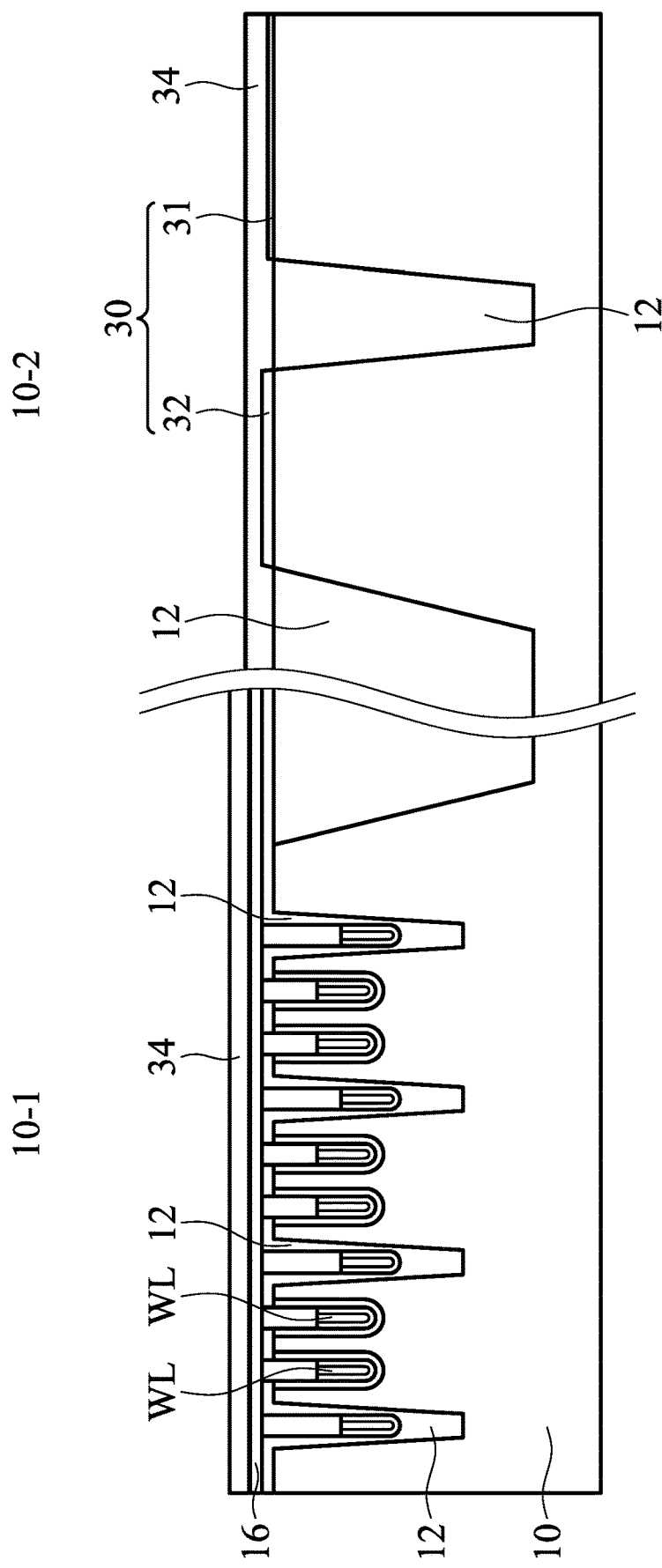

As shown in FIG. 6, a semiconductor layer 34 may be formed on the substrate 10. In more detail, semiconductor layer 34 may be disposed on the silicon nitride layer 16 in the cell region 10-1 and disposed on the dielectric layer 30 (e.g., the first dielectric layer 31 and the second dielectric layer 32) in the peripheral region 10-2. Here, the semiconductor layer 34 may be a non-doped semiconductor layer, such as a non-doped polysilicon layer. That is, the silicon oxide layer 14 and the silicon nitride layer 16 may be disposed between the substrate and the non-doped semiconductor layer 34 (in the cell region 10-1). However, the present disclosure is not limited thereto. In some embodiments, the semiconductor layer 34 may be a silicon-germanium (SiGe) layer, which has a high resistivity.

Figure 7:
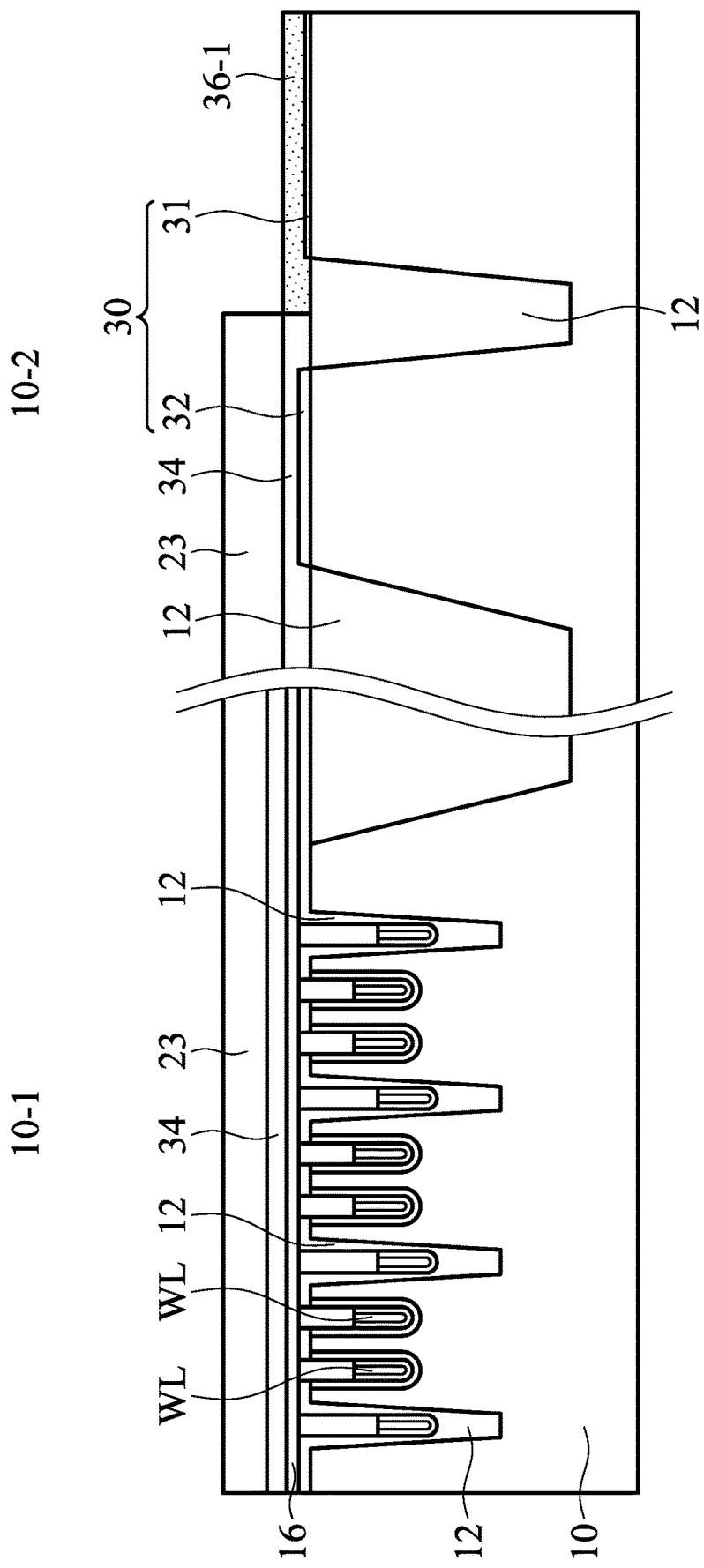
Figure 8:
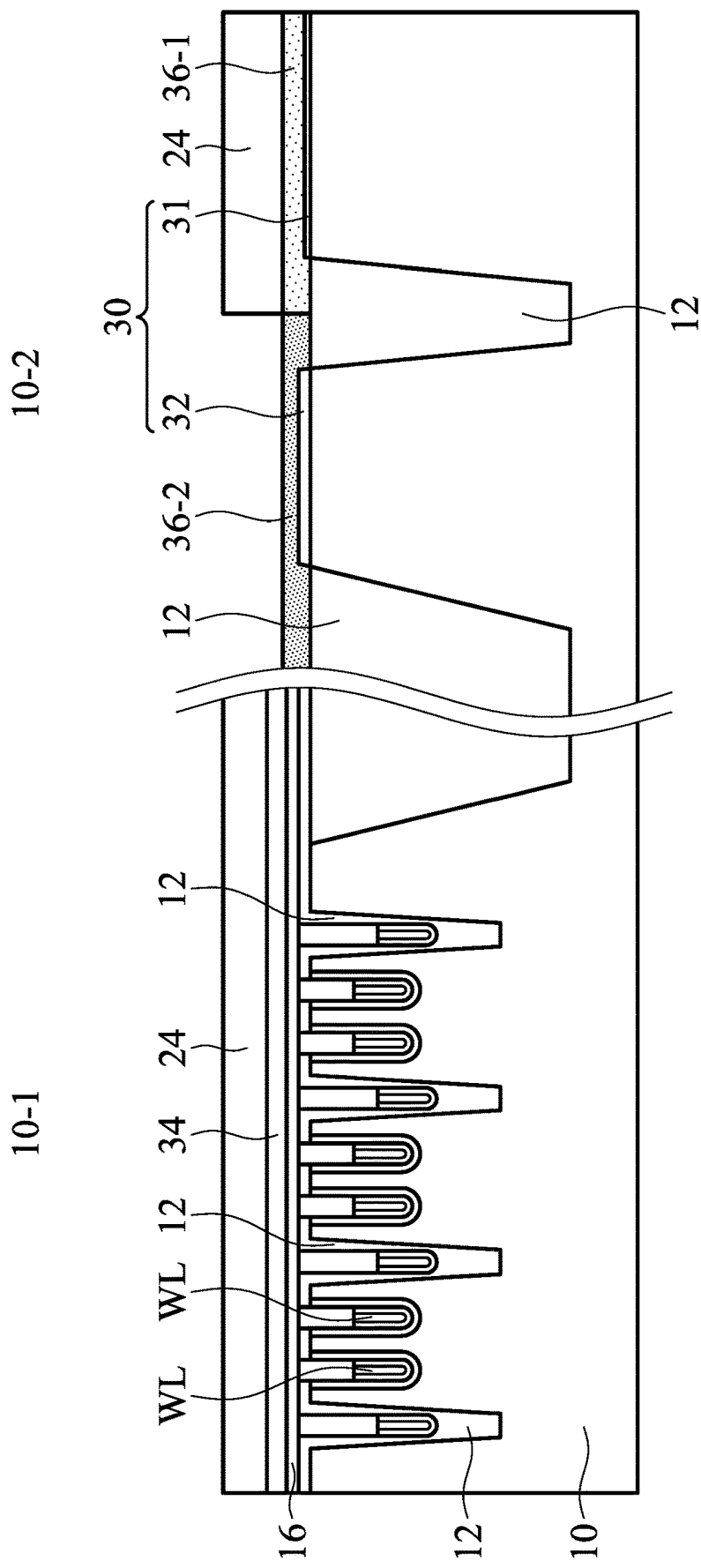

As shown in FIG. 7 and FIG. 8, in some embodiments, the semiconductor layer 34 in the peripheral region 10-2 may be doped. In more detail, a photoresist layer 23 may be formed on the semiconductor layer 34 and expose the portion of the semiconductor layer 34 on the first dielectric layer 31 (i.e., the semiconductor layer 34 in the cell region 10-1 and the semiconductor layer 34 on the second dielectric layer 32 are covered by the photoresist layer 23), and then Boron (B) ions may be doped into the portion of the semiconductor layer 34 on the first dielectric layer 31 to form a first doped semiconductor layer 36-1 by ion implantation or plasma doping shown in FIG. 7. Next, a photoresist layer 24 may be formed on the semiconductor layer 34 and expose the portion of the semiconductor layer 34 on the second dielectric layer 32 (i.e., the semiconductor layer 34 in the cell region 10-1 and the semiconductor layer 34 on the first dielectric layer 31 are covered by the photoresist layer 24), and then Phosphorus (P) ions may be doped into the portion of the semiconductor layer 34 on the second dielectric layer 32 to form a second doped semiconductor layer 36-2 by ion implantation or plasma doping shown in FIG. 8.

Here, the first doped semiconductor layer 36-1 may be disposed on the first dielectric layer 34-1 and have a first conductivity type (e.g., P-type), while the second doped semiconductor layer 36-2 may be disposed on the second dielectric layer 34-2 and have a second conductivity type (e.g., N type), but the present disclosure is not limited thereto.

Figure 9:
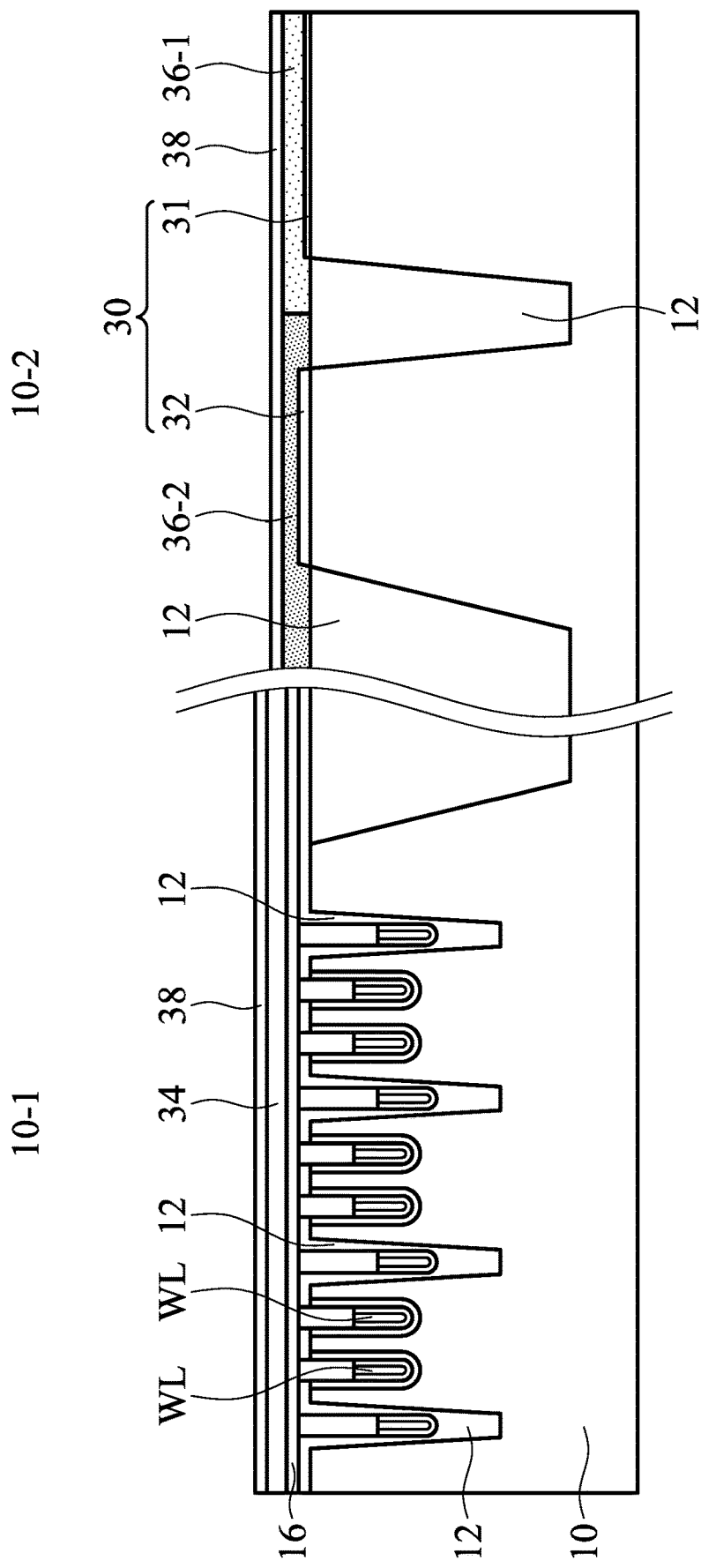

As shown in FIG. 9, in some embodiments, a mask layer 38 may be formed on the semiconductor layer 34. In more detail, the mask layer 38 may be formed on the non-doped semiconductor layer 34 in the cell region 10-1, and formed on the first doped semiconductor layer 36-1 and the second doped semiconductor layer 36-2 in the peripheral region 10-2. In some embodiments, the material of the mask layer 38 may include silicon oxide ($SiO_2$), and mask layer 38 may be formed on the semiconductor layer 34 by atomic layer deposition (ALD), plasma-enhanced chemical vapor deposition (PECVD), low-pressure chemical vapor deposition (LPCVD), other applicable processes, or a combination thereof, but the present disclosure is not limited thereto.

Figure 10:
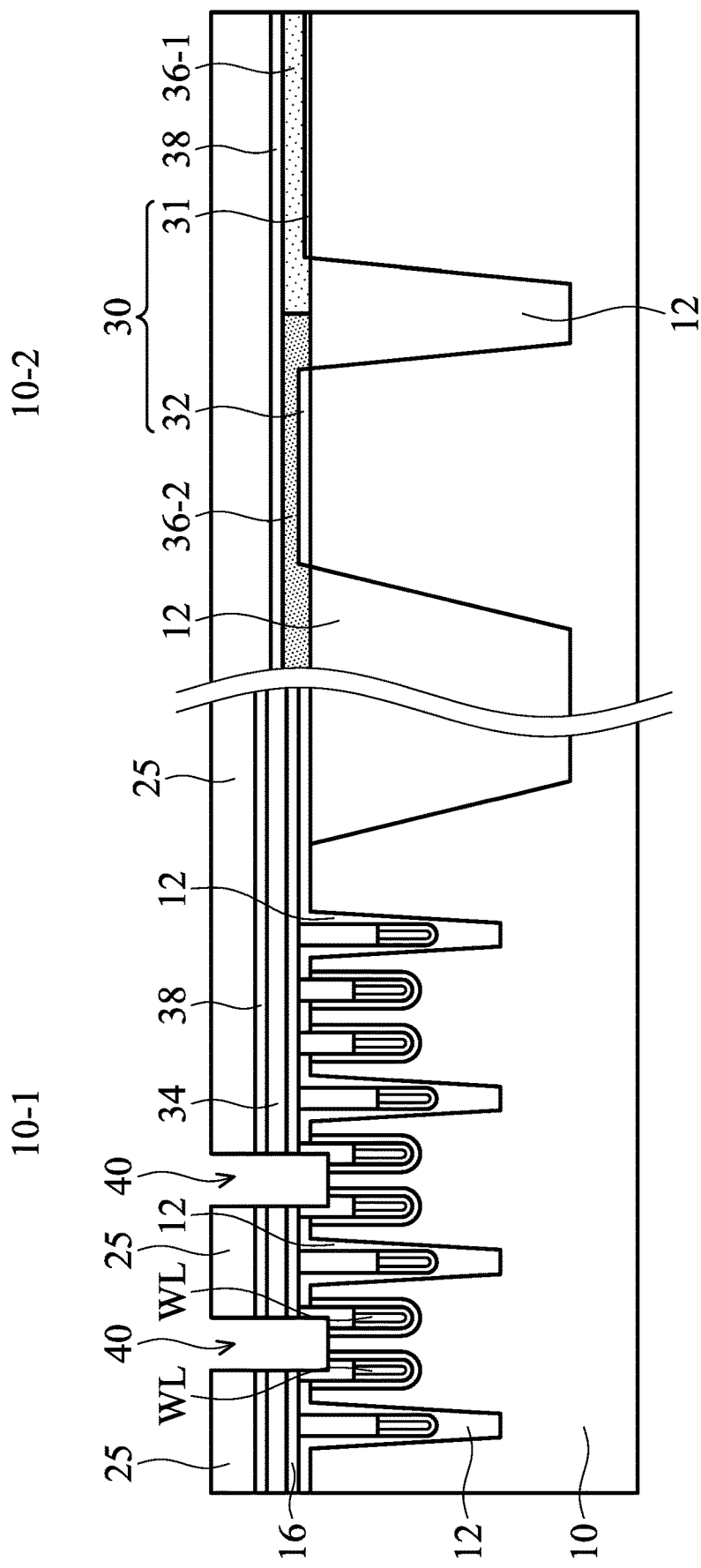

As shown in FIG. 10, the semiconductor layer 34 and the substrate 10 may be patterned to form a plurality of trenches 40. In more detail, a photoresist layer 25 may be formed on the non-doped semiconductor layer 34 (mask layer 38) in the cell region 10-1, and then some portions of the hard mask 38, the non-doped semiconductor layer 34, the silicon nitride layer 16 and the silicon oxide layer 14 may be etched to form the trenches 40. In this embodiment, the trenches 40 may expose portions of the substrate 10.

Figure 11:
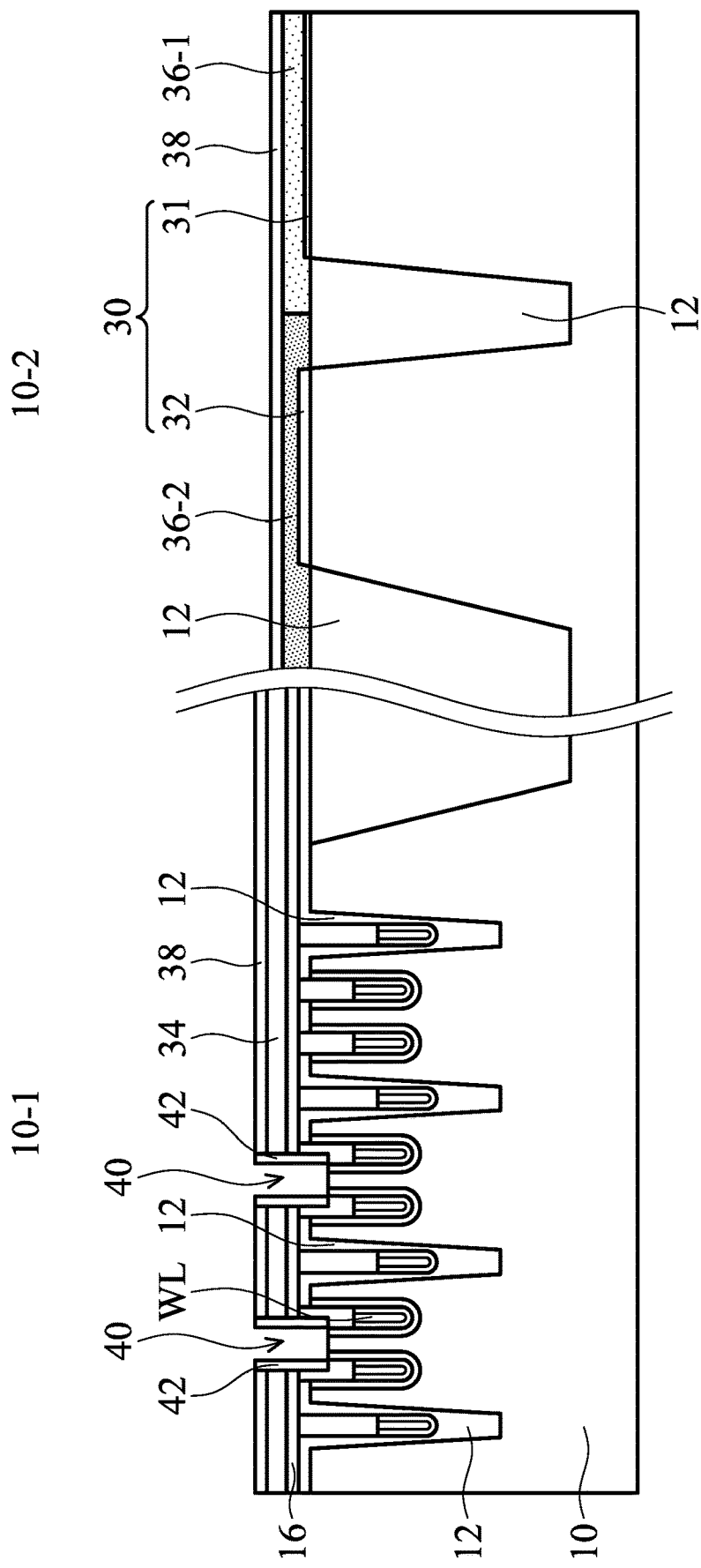

As shown in FIG. 11, in some embodiments, a stop layer 42 may be formed on the side walls of the trenches 40. In some embodiments, the material of the stop layer 42 may include, but is not limited to, silicon nitride (SiN) or silicon oxide ($SiO_2$). In more detail, a silicon nitride (SiN) (or a silicon oxide ($SiO_2$)) material may be deposited in the trenches 40 and on the mask layer 38, and then the portions of the silicon nitride (SiN) (or a silicon oxide ($SiO_2$)) material on the mask layer 38 and on the bottom surfaces of the trenches 40 may be removed (e.g., etched), so that the stop layer 42 may be formed on the side walls of the trenches 40. However, the present disclosure is not limited thereto. In some embodiments, the step as shown in FIG. 11 may be omitted.

Figure 12:
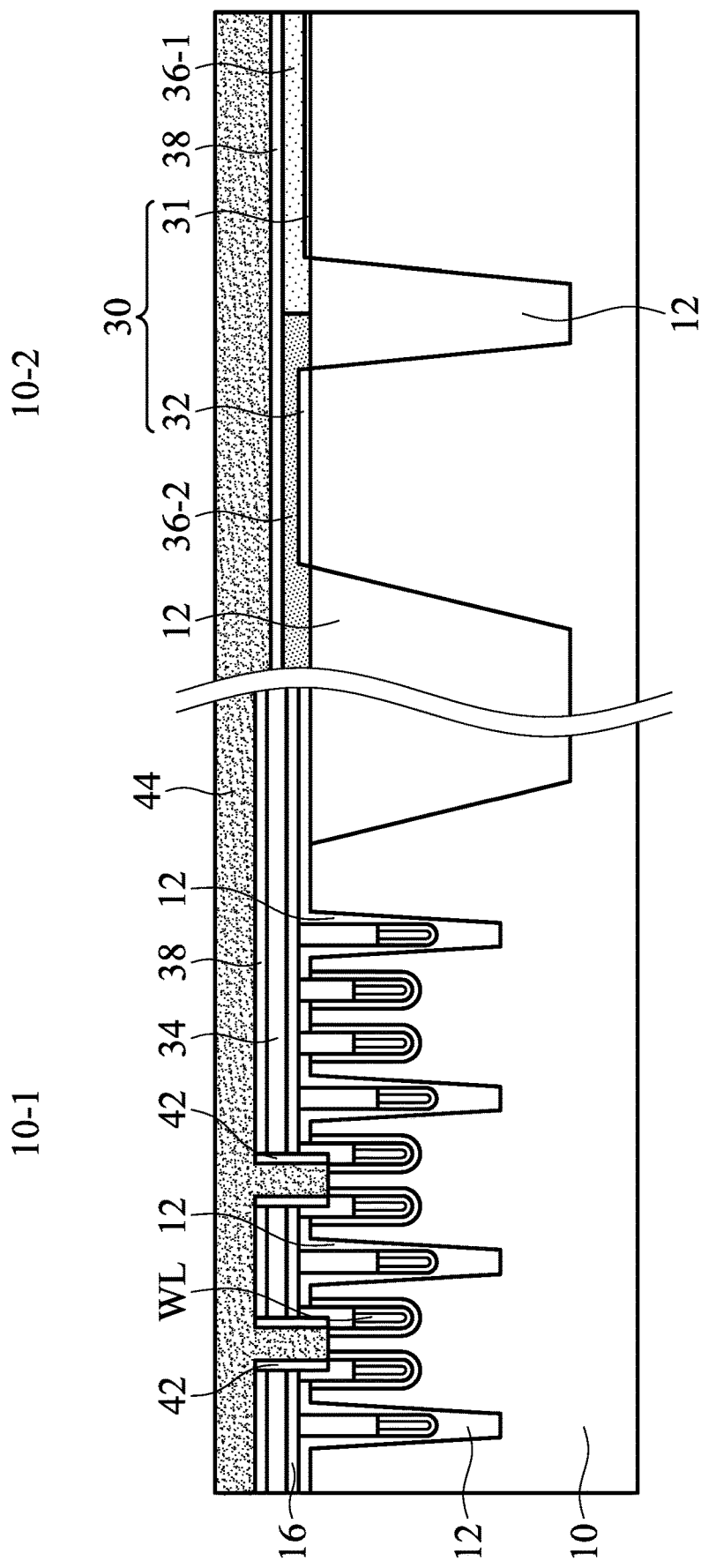

As shown in FIG. 12, a doped-material layer 44 may be formed on the semiconductor layer 34 (mask layer 38) and the trenches 40 may be filled with the doped-material layer 44. In more detail, the doped-material layer 44 may be formed by depositing a semiconductor material on the mask layer 38 and in the trenches 40, and then doping the semiconductor material. In some embodiments, Phosphorus (P) ions may be doped into the semiconductor material by ion implantation to form the doped-material layer 44, but the present disclosure is not limited thereto. In other embodiments, the doped-material layer 44 may be formed by depositing a Phosphorus-doped polysilicon on the mask layer 38 and in the trenches 40. Here, doped-material layer 44 may have low resistivity to be electrically connected to the substrate 10. Since the mask layer 38 may be disposed between the semiconductor material and the non-doped semiconductor layer 34, the non-doped semiconductor layer 34 may be protected by the mask layer 38 during the doping process (e.g., ion implantation).

Figure 13:
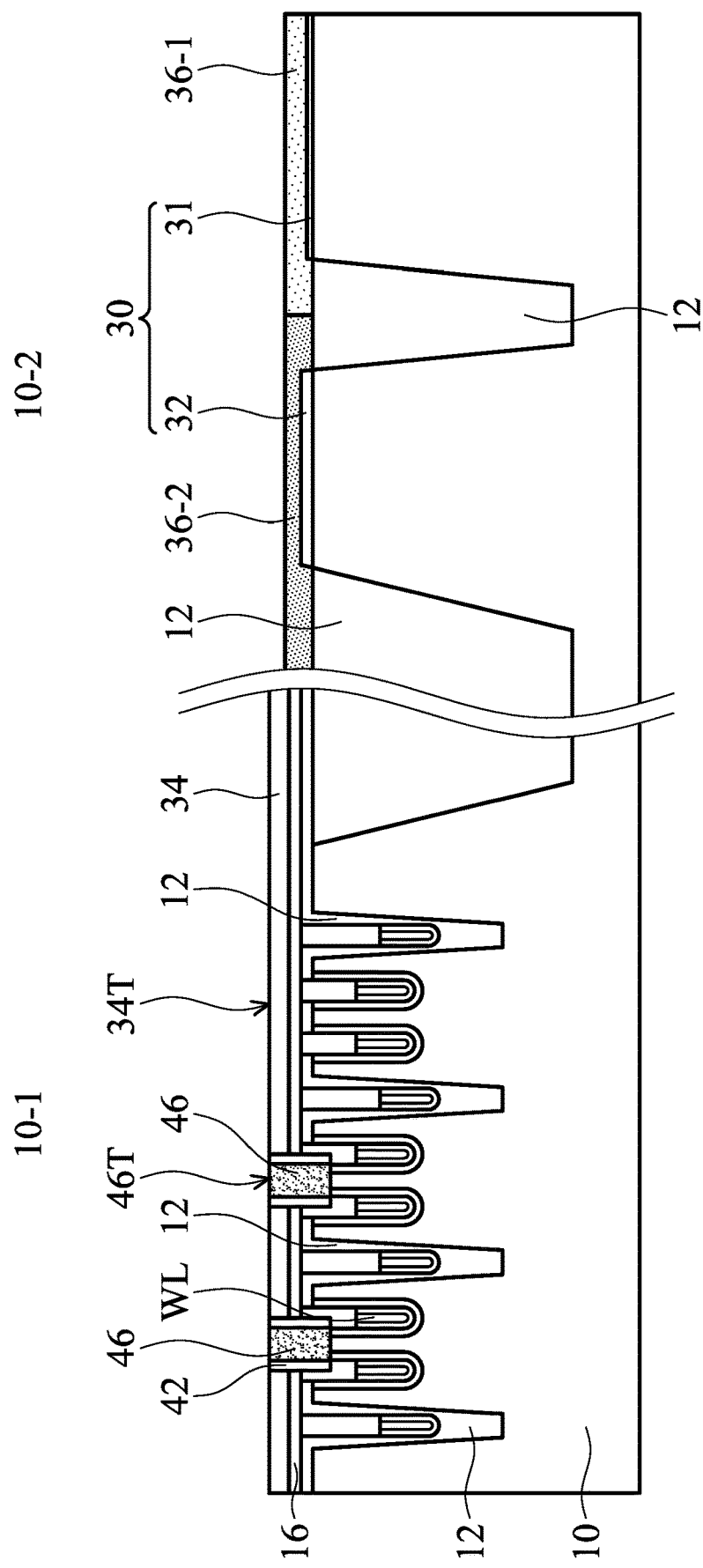

As shown in FIG. 13, a portion of the doped-material layer 44 may be removed to form a plurality of contact portions 46. For example, the portion of the doped-material layer 44 above the mask layer 38 may be etched back by dry etching, for example, such that the top surface 46T of each of the contact portions 46 may be aligned with, or lower than, the top surface 34T of the non-doped semiconductor layer 34. Then, the mask layer 38 may be removed, so that top surface 46T of each of the contact portions 46, top surface 34T of the non-doped semiconductor layer 34, the top surface of the first doped semiconductor layer 36-1 and the top surface of the second doped semiconductor layer 36-2 may be exposed. In this embodiment, the contact portions 46 may be adjacent to the non-doped semiconductor layer 34 and in direct contact with the substrate 10 as shown in FIG. 13.

Figure 14:
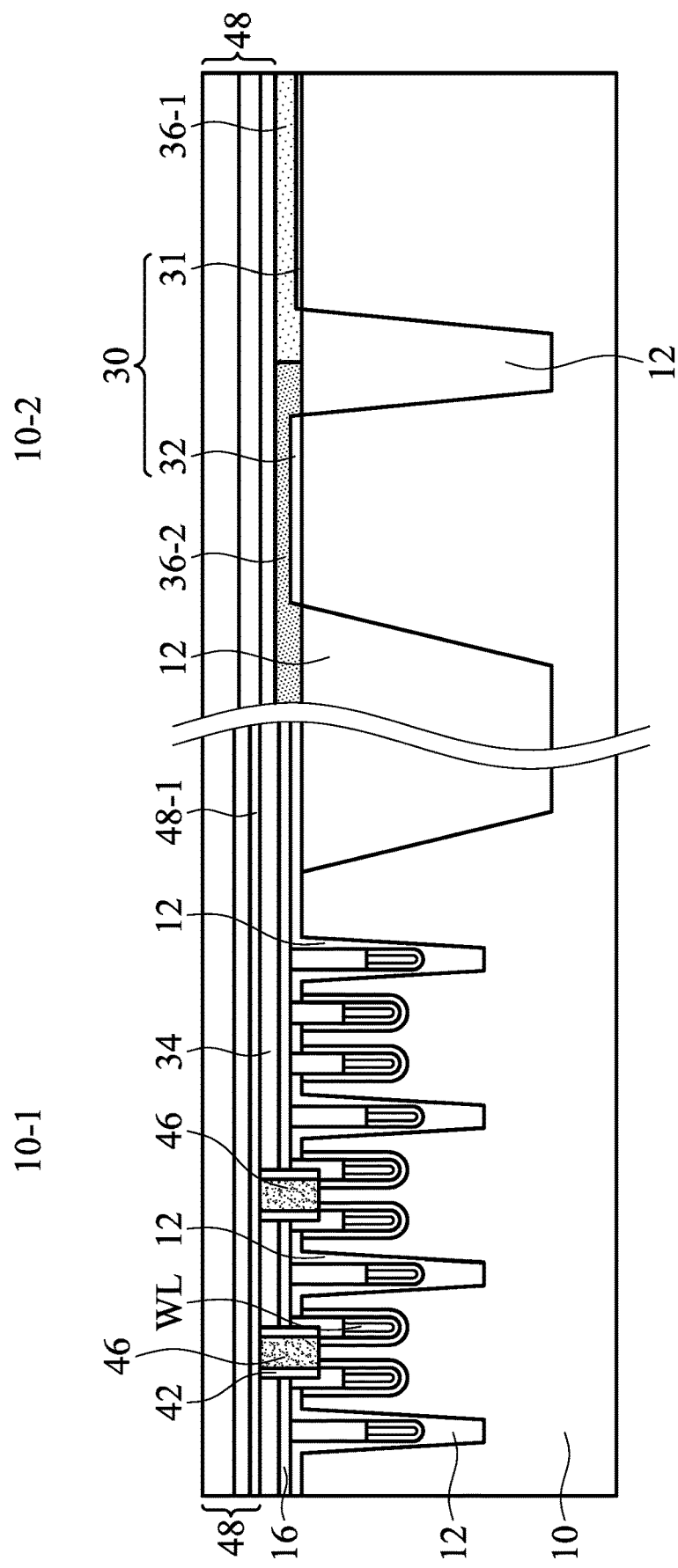

As shown in FIG. 14, a metal-stacking layer 48 may be formed on the semiconductor layer 34. In more detail, the metal-stacking layer 48 may be formed on the non-doped semiconductor layer 34 in the cell region 10-1, and on the first doped semiconductor layer 36-1 and the second doped semiconductor layer 36-2 in the peripheral region 10-2. In this embodiment, the metal-stacking layer 48 may be in direct contact with the contact portions 46. In some embodiments, the metal-stacking layer 48 may be formed as a multi-layer structure, and the metal-stacking layer 48 (the multi-layer structure) may include titanium, titanium nitride, tungsten, tungsten silicide, tungsten nitride, titanium disilicide ($TiSi_2$) or other applicable materials, but the present disclosure is not limited thereto. For example, the metal-stacking layer 48 may include a titanium disilicide ($TiSi_2$) layer 48-1. The titanium disilicide layer 48-1 may be in direct contact with the contact portions 46 to reduce the interface resistance between the contact portions 46 and the metal-stacking layer 48.

Figure 15:
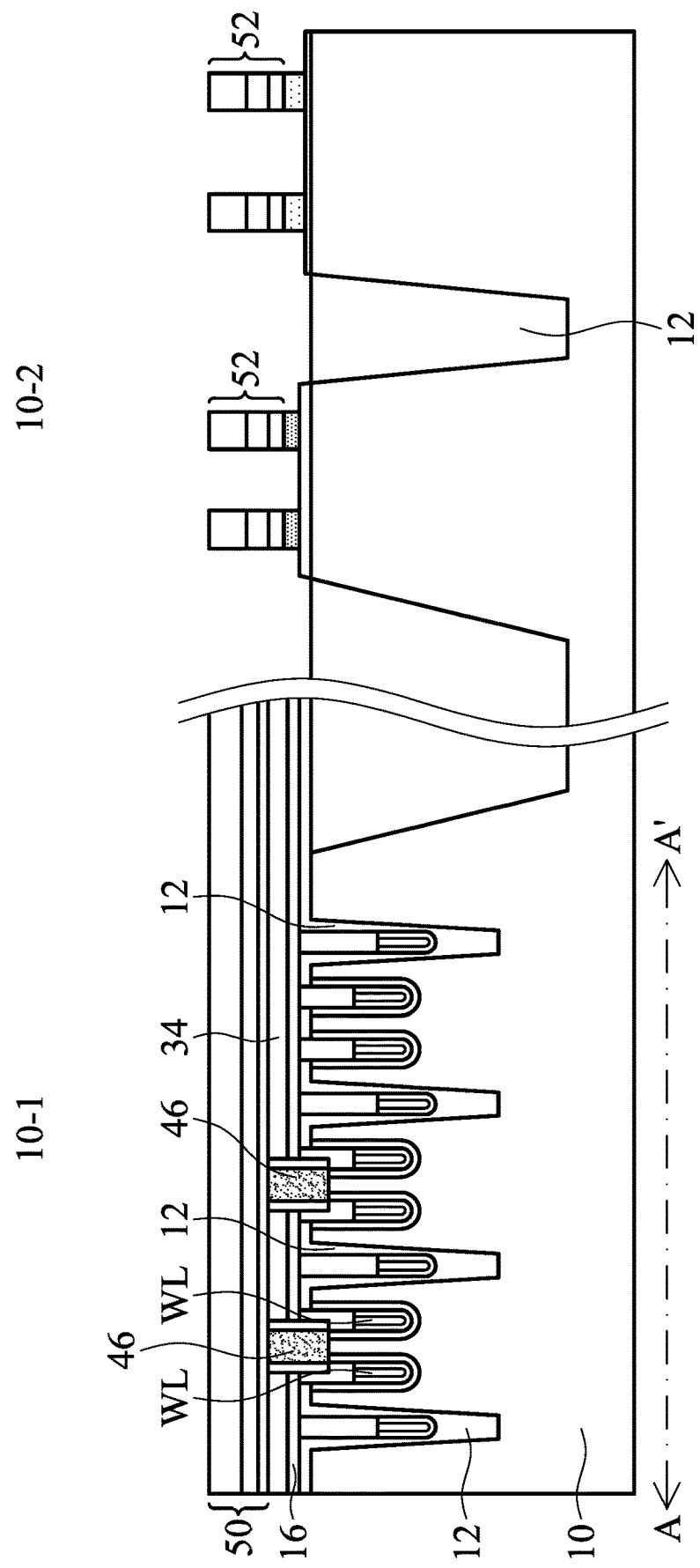

As shown in FIG. 15, the metal-stacking layer 48 and the semiconductor layer 34 (the first doped semiconductor layer 36-1 and the second doped semiconductor layer 36-2) may be patterned to form the memory device 100. For example, the metal-stacking layer 48 may be etched to form a plurality of bit lines 50 in the cell region 10-1, and the metal-stacking layer 48, the first doped semiconductor layer 36-1 and the second doped semiconductor layer 36-2 may be etched to form a plurality of gate conductors 52 in the peripheral region 10-2. It should be noted that the non-doped semiconductor layer 34 in the cell region 10-1 and the first doped semiconductor layer 36-1, the second doped semiconductor layer 36-2 in the peripheral region 10-2 may also be patterned. Moreover, the word lines WL may be buried gate regions, and the substrate 10 may include source/drain regions and channel regions (not illustrated in detail in FIG. 15) surrounding the buried gate regions. That is, the contact portions 46 may be in direct contact with the source/drain regions in the cell region 10-1 of the substrate 10.

In some embodiments, the deposition process mentioned above may include, but is not limited to, chemical vapor deposition (CVD), high-density plasma chemical vapor deposition (HDPCVD), plasma-enhanced chemical vapor deposition (PECVD), low-pressure chemical vapor deposition (LPCVD), other applicable processes, or a combination thereof. In some embodiments, the etching process mentioned above may include, but is not limited to, wet etching, dry etching, other applicable processes, or a combination thereof.

Figure 16:
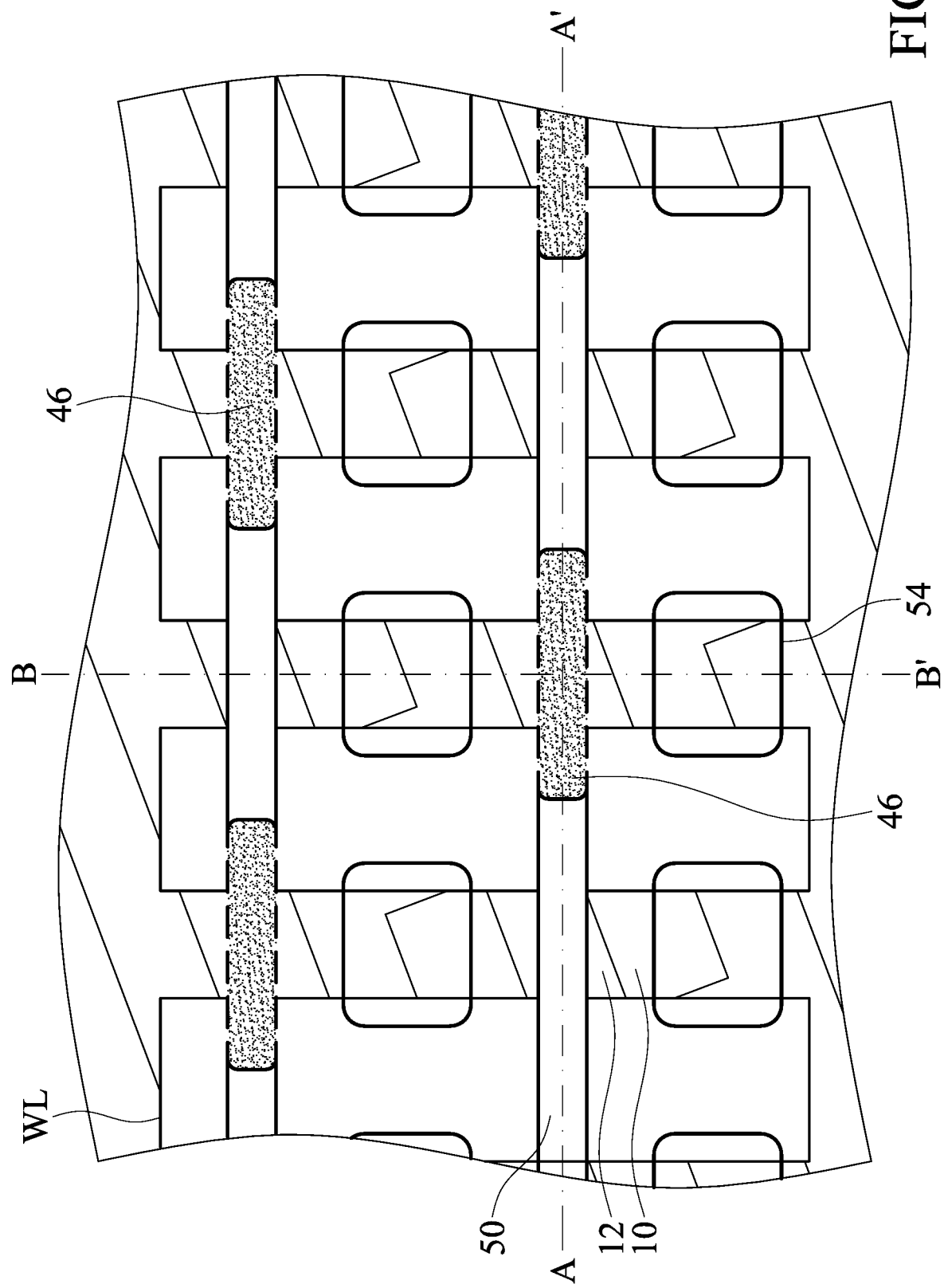
FIG. 16 is a partial top view illustrating the memory device in accordance with an embodiment of the present disclosure.

Here, FIG. 15 may have a partial cross-sectional view illustrating the memory device 100 along line A-A' in FIG. 16, but some components are not show in FIG. 15 (e.g., capacitor contact 54 and capacitor). It should be noted that not all components of the memory device 100 are shown in FIG. 16 and FIG. 17, for the sake of brevity.

Figure 17:
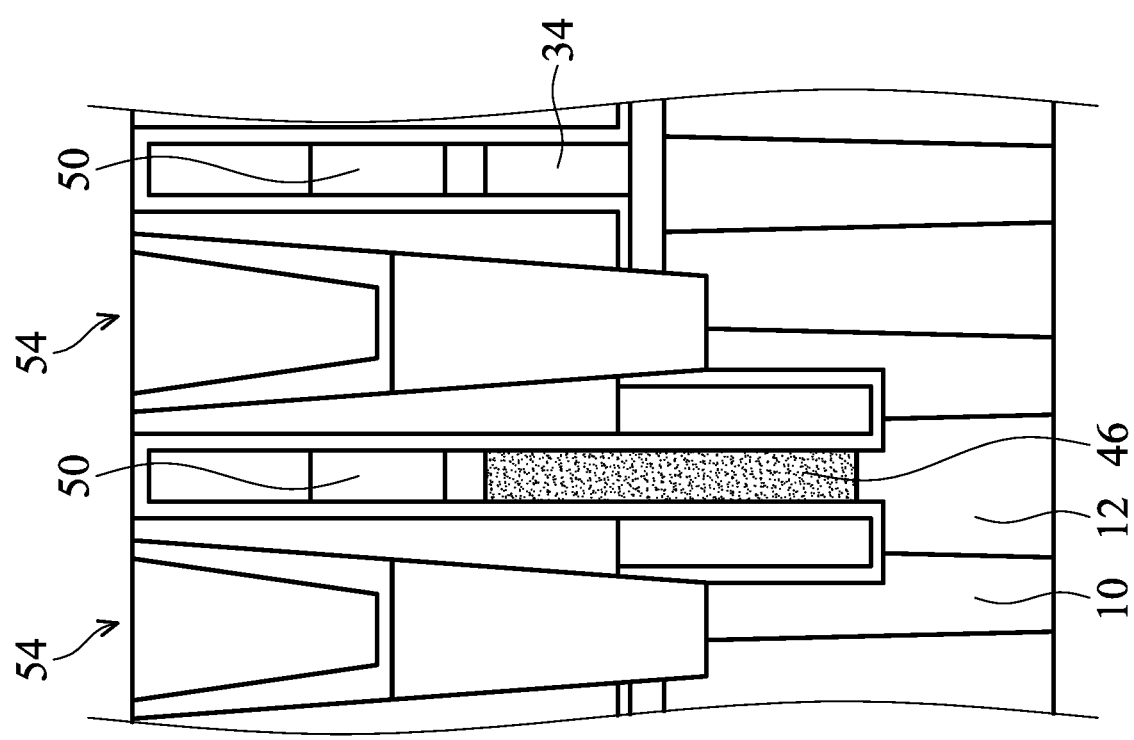
FIG. 17 is a partial cross-sectional view illustrating the memory device along line B-B' in FIG. 16.

As shown in FIG. 16 and FIG. 17, since the non-doped semiconductor layer 34 may have high resistivity (e.g., about 10E3 Ωm at room temperature), which may be closer to an insulator, the electric line force of the non-doped semiconductor layer 34 may be less than the doped semiconductor layer. Therefore, the bit line parasitic capacitance between a bit line 50 and another bit line 50 or between a bit line 50 and a capacitor contact 54 may be effectively reduced.

In summary, the memory device 100 with the non-doped semiconductor layer 34 in accordance with the embodiments of the present disclosure may have low parasitic capacitance. Furthermore, the method for fabricating the memory device 100 in accordance with the embodiments of the present disclosure may minimize the gap between the cell region 10-1 and the peripheral region 10-2 of the memory device 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

What is claimed is:

1. A method for fabricating a memory device, comprising:
   providing a substrate, wherein the substrate has a cell region and a peripheral region, and comprises a plurality of word lines and a plurality of isolation structures;
   forming a silicon nitride layer on the substrate in the cell region;
   forming a semiconductor layer on the substrate, wherein the silicon nitride layer is disposed between the substrate and the semiconductor layer;
   patterning the semiconductor layer, the silicon nitride layer, and the substrate in the cell region to form a plurality of trenches, wherein the trenches expose portions of the substrate, and a bottom surface of each of the trenches is lower than a top surface of the substrate;
   forming a doped-material layer on the semiconductor layer and filling the trenches;
   removing a portion of the doped-material layer to form a plurality of contact portions, such that a top surface of each of the contact portions is aligned with, or lower than, a top surface of the semiconductor layer; and
   forming a metal-stacking layer on the semiconductor layer, wherein the metal-stacking layer is disposed on the contact portions.

2. The method according to claim 1, wherein before the step of depositing the doped-material layer on the semiconductor layer and filling the trenches, the method further comprises:
forming a stop layer on side walls of the trenches.

3. The method according to claim 2, wherein a material of the stop layer comprises silicon nitride or silicon oxide.

4. The method according to claim 1, wherein before the step of depositing the semiconductor layer on the substrate, the method further comprises:
forming a dielectric layer on the substrate in the peripheral region.

5. The method according to claim 4, wherein the dielectric layer comprises a first dielectric layer and a second dielectric layer, and the second dielectric layer is thicker than the first dielectric layer.

6. The method according to claim 5, further comprising:
doping the semiconductor layer in the peripheral region;
wherein the semiconductor layer on the first dielectric layer has a first conductivity type and the semiconductor layer on the second dielectric layer has a second conductivity type that is different than the first conductivity type.

7. The method according to claim 4, wherein before the step of forming the dielectric layer on the substrate in the peripheral region, the method further comprises:
forming a silicon oxide layer on the substrate, wherein the silicon oxide layer in the cell region is disposed between the substrate and the silicon nitride layer; and
removing the silicon oxide layer in the peripheral region.

8. The method according to claim 1, further comprising:
patterning the metal-stacking layer to form a plurality of bit lines on the contact portions and the semiconductor layer.

9. The method according to claim 8, further comprising:
forming a capacitor contact and a capacitor between the bit lines.

10. The method according to claim 1, wherein the metal-stacking layer comprises titanium, titanium nitride, tungsten, tungsten silicide, or tungsten nitride.

11. A memory device, comprising:
a substrate comprising a plurality of word lines and a plurality of isolation structures, wherein the substrate has a cell region and a peripheral region;
a silicon nitride layer disposed on the substrate in the cell region;
a non-doped semiconductor layer disposed on the silicon nitride layer, wherein the silicon nitride layer is disposed between the substrate and the non-doped semiconductor layer;
a plurality of contact portions adjacent to the non-doped semiconductor layer, wherein a bottom surface of each of the contact portions is lower than a top surface of the substrate; and
a metal-stacking layer disposed on the substrate, wherein a portion of the metal-stacking layer is disposed on the non-doped semiconductor layer and the contact portions.

12. The memory device according to claim 11, further comprising:
a stop layer disposed between each of the contact portions and the non-doped semiconductor layer.

13. The memory device according to claim 12, wherein a material of the stop layer comprises silicon nitride or silicon oxide.

14. The memory device according to claim 11, wherein the memory device further comprises:
a dielectric layer disposed on the substrate in the peripheral region.

15. The memory device according to claim 14, wherein the dielectric layer is divided into a first dielectric layer and a second dielectric layer, and the second dielectric layer is thicker than the first dielectric layer.

16. The memory device according to claim 15, further comprising:
a first doped semiconductor layer disposed on the first dielectric layer; and
a second doped semiconductor layer disposed on the second dielectric layer;
wherein the first doped semiconductor layer has a first conductivity type and the second doped semiconductor layer has a second conductivity type that is different than the first conductivity type.

17. The memory device according to claim 16, wherein the first conductivity type is P-type and the second conductivity type is N-type.

18. The memory device according to claim 16, wherein another portion of the metal-stacking layer is disposed on the first doped semiconductor layer and the second doped semiconductor layer.

19. The memory device according to claim 14, further comprising:
a silicon oxide layer disposed under the silicon nitride layer;
wherein the silicon oxide layer and the silicon nitride layer are disposed between the substrate and the non-doped semiconductor layer.

20. The memory device according to claim 11, wherein the metal-stacking layer comprises titanium, titanium nitride, tungsten, tungsten silicide, or tungsten nitride.

* * * * *